United States Patent
Goshima

(10) Patent No.: US 8,258,491 B2
(45) Date of Patent: Sep. 4, 2012

(54) PATTERN WRITING SYSTEM AND PARAMETERS MONITORING METHOD FOR PATTERN WRITING APPARATUS

(75) Inventor: Yoshikuni Goshima, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 578 days.

(21) Appl. No.: 12/406,390

(22) Filed: Mar. 18, 2009

(65) Prior Publication Data
US 2009/0237824 A1 Sep. 24, 2009

(30) Foreign Application Priority Data
Mar. 19, 2008 (JP) .................. 2008-071472

(51) Int. Cl.
*G21K 5/00* (2006.01)
(52) U.S. Cl. .................. 250/492.2; 369/47.16
(58) Field of Classification Search .......... 250/396, 250/492.2, 491.1, 492.21, 492.22, 396 R, 250/396 ML; 369/47.16
See application file for complete search history.

(56) References Cited

U.S. PATENT DOCUMENTS

| | | | |
|---|---|---|---|
| 6,734,428 B2 | 5/2004 | Parker et al. | |
| 6,835,937 B1 * | 12/2004 | Muraki et al. | 250/396 R |
| 2002/0054703 A1 * | 5/2002 | Hiroi et al. | 382/149 |
| 2002/0160311 A1 * | 10/2002 | Muraki et al. | 430/296 |
| 2003/0066963 A1 * | 4/2003 | Parker et al. | 250/310 |
| 2003/0066974 A1 * | 4/2003 | Muraki | 250/492.2 |
| 2004/0125355 A1 * | 7/2004 | Naya et al. | 355/133 |
| 2008/0067431 A1 | 3/2008 | Horiuchi et al. | |

FOREIGN PATENT DOCUMENTS

| | | |
|---|---|---|
| JP | 2001-052992 | 2/2001 |
| JP | 2001-168018 | 6/2001 |
| JP | 2007-294562 | 11/2007 |
| JP | 2008-71929 | 3/2008 |

OTHER PUBLICATIONS

Korean Office Action issued on Jan. 14, 2011, in the corresponding Korean Patent Application No. 10-2009-0022865 (with English Translation).
Office Action issued Sep. 22, 2011 in Korea Application No. 10-2009-0022865 (With English Translation).
Japanese Office Action mailed on May 15, 2012 in the counterpart Japanese application 2008-071472 filed on Mar. 19, 2008 with English translation.

* cited by examiner

*Primary Examiner* — Thomas Alunkal
(74) *Attorney, Agent, or Firm* — Oblon, Spivak, McClelland, Maier & Neustadt, L.L.P.

(57) ABSTRACT

A pattern writing system includes a plurality of control units configured to use different communication standards; a pattern writing unit configured to be controlled by the plurality of control units and write a pattern on a target object by using a charged particle beam; a storage unit configured to receive parameter information from an external slave computer and stores the parameter information; a first interface information circuit group configured to output a received parameter information to at least one of the plurality of control units in conformity with a communication standard on the at least one of plurality of control units; a main computer; and a second interface circuit group configured to receive a request from the main computer, input parameter information been setting in the plurality of control units without passing through the storage unit, convert communication standards of the parameter information input into a communication standard used by the main computer, and output the parameter information whose each communication standard is converted to the main computer.

9 Claims, 5 Drawing Sheets

PATTERN WRITING SYSTEM AND PARAMETERS MONITORING METHOD FOR PATTERN WRITING APPARATUS

CROSS-REFERENCE TO RELATED APPLICATION

This application is based upon and claims the benefit of priority from prior Japanese Patent Application No. 2008-071472 filed on Mar. 19, 2008 in Japan, the entire contents of which are incorporated herein by reference.

BACKGROUND OF THE INVENTION

1. Field of the Invention

The present invention relates to a pattern writing system and a pattern monitoring method for a pattern writing apparatus, for example, a pattern writing system that writes a pattern on a target object by use of an electron beam and a method of monitoring parameters set in the system.

2. Related Art

A lithography technique that leads development of micropatterning of a semiconductor device is a very important process that generates a pattern in semiconductor manufacturing processes. In recent years, with an increase in LSI integration density, the circuit line width required for a semiconductor device is further miniaturized every year. A high-precision original pattern (also called a reticle or a mask) is necessary in order to form the desired circuit pattern on such a semiconductor device. In such cases, an electron beam pattern writing technique essentially has an excellent resolution and is used in production of high-precision original patterns.

FIG. 5 is a conceptual diagram that explains the operation of a conventional variable-shaped electron beam photolithography apparatus.

The operation of the variable-shaped electron beam (EB) photolithography apparatus will be described below. In the first aperture plate 410, an oblong (e.g. rectangular) opening 411 is formed to shape an electron beam 330. In the second aperture plate 420, a variable-shaped opening 421 is formed to shape the electron beam 330 passing through the opening 411 of the first aperture plate 410 into the desired oblong shape. The electron beam 330 irradiated from the charged particle source 430 and passing through the opening 411 of the first aperture plate 410 is deflected by a deflector, passes through a part of the variable-shaped opening 421 of the second aperture plate 420, and is irradiated on a target object 340 placed on a stage continuously moving in one predetermined direction (e.g. direction X). More specifically, an oblong shape that can pass through both the opening 411 of the first aperture plate 410 and the variable-shaped opening 421 of the second aperture plate 420 is written in a pattern writing region on the target object 340 that is placed on the stage and continuously moving in the direction X. The scheme that causes a beam to pass through the opening 411 of the first aperture plate 410 and the variable-shaped opening 421 of the second aperture plate 420 to form an arbitrary shape is called a variable-shaping scheme (for an example, see Japanese Unexamined Patent Publication No. 2007-294562).

In this case, in a pattern writing apparatus typified by an electron beam photolithography apparatus, a very large number of pieces of apparatus application information (parameters) are prepared in order to variably apply the apparatus. Quality management of products produced by the pattern writing requires change management of these parameters.

However, it is technically difficult for the owner (manager) himself/herself to manage the parameters of the pattern writing apparatus that have been developed into various forms on an apparatus. This is because when the pattern writing apparatus goes online, the apparatus parameters can be remotely changed to make it possible to designate changes at any time. Furthermore, as described below, parameter management is difficult.

FIG. 6 is a conceptual diagram showing a sample configuration of a pattern writing system.

In this case, after parameters designated by personal computers (PC) 552 and 554 of users A and B or other such parameters to be changed are stored in database 540 or other such databases first, the settings of devices 522 and 524, which control a pattern writing unit 510 through interface (I/F) circuits 534 and 536, are changed. The devices 522 and 524 the parameters, of which those that are set frequently have different communication specifications. For this reason, in the configuration, the devices 522 and 524 the parameters set cannot be easily directly accessed from a management PC 560. In a conventional technique, in order to check whether the parameters differ from those of the reference 564, the apparatus owner checks the parameters stored in the database 540 by using a management PC 560. However, even though the parameters are stored in the database 540 or other similar locations, a slight time lag occurs until the parameters are set in the devices 522 and 524 in the actual pattern writing apparatus. As a result, the contents in the database 540 may differ from those set in the devices 522 and 524 of the actual device. For this reason, even though the parameters of the reference are matched with the parameters in the database, the contents of the reference 564 may differ from those set in the devices 522 and 524. In this manner, even though the parameters of the reference are compared with the parameters in the database, pattern writing that is not based on the assumption that settings in the real device are different may be at a disadvantage when performed.

As described above, when it cannot be predicted at what time settings will be changed nor who will change them, the content in the database may differ from that set in the actual device, and parameter management by the apparatus owner is very difficult.

As described above, even though the parameters stored in the database are checked via a management PC, the contents of the database and the contents set in the actual device may be different an unexpected pattern writing may be at a disadvantage when performed. In particular, with micropatterning of a pattern and the complexity of the pattern writing apparatus, this problem is very serious in regard to the management of enormous numbers of parameters.

BRIEF SUMMARY OF THE INVENTION

The object of the present invention is to provide a pattern writing system and method that can perform parameter management.

In accordance with one aspect of this invention, a pattern writing system includes a plurality of control units configured to use different communication standards; a pattern writing unit configured to be controlled by the plurality of control units and write a pattern on a target object by using a charged particle beam; a storage unit configured to receive parameter information from an external slave computer and stores the parameter information; a first interface information circuit group configured to output a received parameter information to at least one of the plurality of control units in conformity with a communication standard on the at least one of plurality of control units; a main computer; and a second interface circuit group configured to receive a request from the main computer, input parameter information been setting in the plurality of control units without passing through the storage unit, convert communication standards of the parameter information input into a communication standard used by the main computer, and output the parameter information whose each communication standard is converted to the main computer.

In accordance with another aspect of the invention, a parameter monitoring method for a pattern writing apparatus, comprising receiving each of reference parameter information for setting in a plurality of control units which control the pattern writing apparatus and use different communication standards; receiving each of setting parameter information been setting in the plurality of control units by an external computer through a storage device that can be accessed by said external computer, without passing through the storage device; and comparing a received each of reference parameter information with corresponding setting parameter information of a received each of setting parameter information to output a result compared.

DETAILED DESCRIPTION OF THE INVENTION

Embodiment 1

In an embodiment a configuration using an electron beam will be described below as an example of a charged particle beam. The charged particle beam is not limited to an electron beam. A beam such as an ion beam using other charged particles may be used as the charged particle beam.

Figure 1:
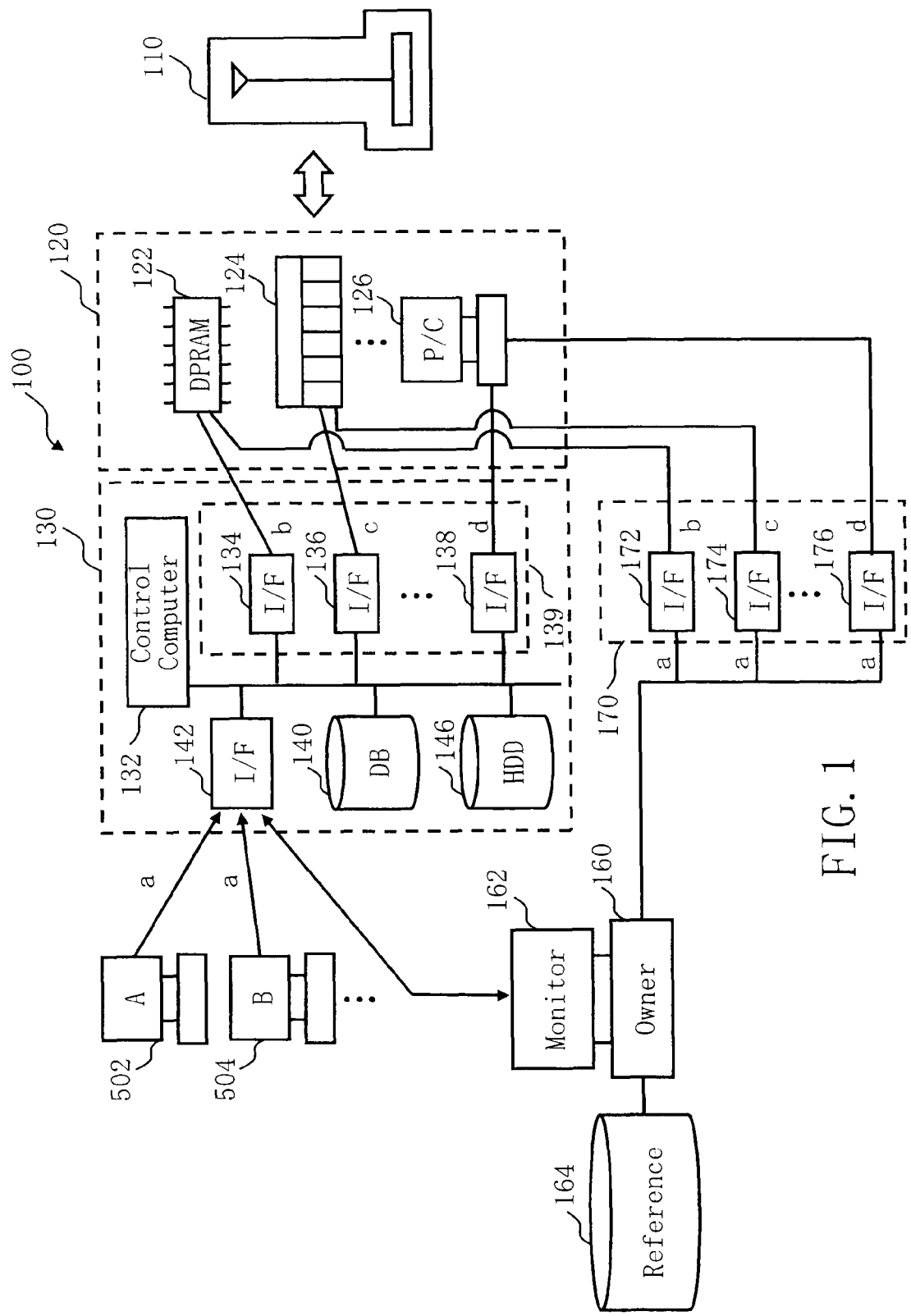
FIG. 1 is a conceptual diagram showing a configuration of a pattern writing system according to Embodiment 1.

FIG. 1 is a conceptual diagram showing o configuration of a pattern writing system according to Embodiment 1. In FIG. 1, a pattern writing system 100 is an example of a charged particle beam pattern writing system. The pattern writing system 100 includes a pattern writing apparatus 110, a control unit 120, a control calculation unit 130, a main computer 160, a monitor 162, a storage device 164, and an I/F circuit group 170. In the control unit 120, a number of control units 122, 124, and 126 are arranged, each with differing communication standards. A digital circuit substrate or the like can be used as the control unit 122. A sequencer device or the like can be used as the control unit 124. A personal computer (PC) or the like can be used as the control unit 126. In the control calculation unit 130, a control computer 132, I/F circuits 134, 136, 138, and 142, a database 140, and a magnetic disk device 146 are arranged and connected to each other through a bus 144. In this case, the I/F circuits 134, 136, and 138 constitute an I/F circuit group 139. In the database 140, parameters set by the plurality of control units 122, 124, and 126 are stored. The monitor 162 and the storage device 164 are connected to the main computer 160. In the storage device 164, a reference serving as standards for the parameters set in the majority of the control units 122, 124, and 126 is stored. In FIG. 1, descriptions of those parts that are not necessary constituent elements required for explaining Embodiment 1 are omitted. The pattern writing system 100 may include another necessary configuration as a matter of course.

Figure 2:
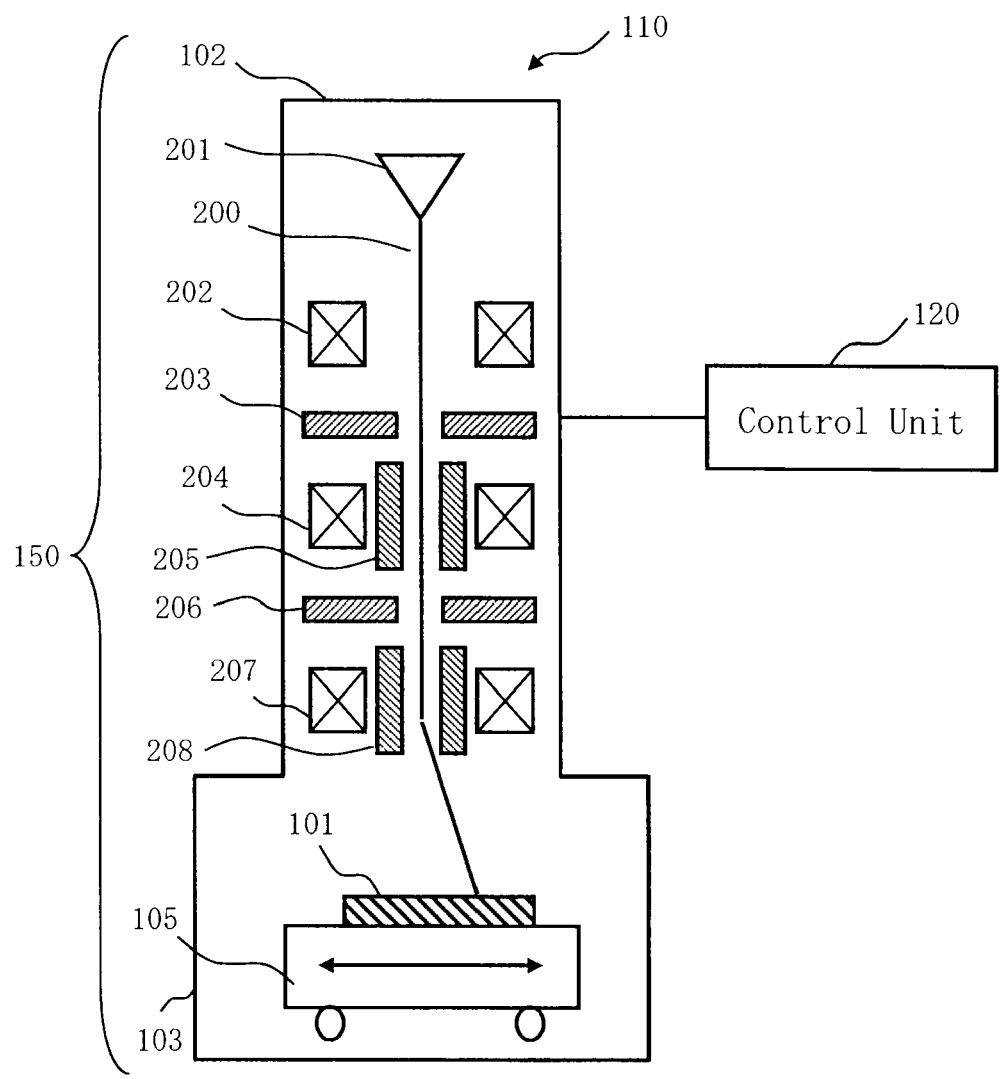
FIG. 2 is a conceptual diagram showing a configuration of a pattern writing apparatus according to Embodiment 1.

FIG. 2 is a conceptual diagram showing a configuration of the pattern writing apparatus according to Embodiment 1. In FIG. 2, the pattern writing apparatus 110 is an example of the charged particle beam pattern writing apparatus. The pattern writing apparatus 110 includes an electron lens barrel 102 arranged in and above a pattern writing chamber 103. The pattern writing chamber 103 and the electron lens barrel 102 configure a pattern writing unit. In the electron lens barrel 102, an electron gun assembly 201, an illumination lens 202, a first aperture plate 203, a projection lens 204, a deflector 205, a second aperture plate 206, an objective lens 207, and a deflector 208 are arranged. In the pattern writing chamber 103, an X-Y stage 105 is arranged. On the X-Y stage 105, the target object 101 serving as the object to be written is arranged. The wafer on which a semiconductor device is formed and an exposure mask which transfers a pattern to the wafer are included as the target object 101. Mask blanks on which any pattern is not formed are included in this mask. The pattern writing apparatus 110 is controlled by the control unit 120 shown in FIG. 1.

An electron beam 200 emitted from the electron gun assembly 201 illuminates an entire area of the first aperture plate 203 having an oblong, for example, rectangular hole by the illumination lens 202. In this case, the electron beam 200 is shaped into an oblong or a rectangle first. The electron beam 200 of a first aperture image passing through the first aperture plate 203 is projected on the second aperture plate 206 by the projection lens 204. A position of the first aperture image on the second aperture plate 206 is deflected and controlled by the deflector 205 to make it possible to change a beam shape and a beam size. The electron beam 200 of the second aperture image passing through the second aperture plate 206 is focused by an objective lens 207, deflected by a deflector 208, and irradiated on the desired position of the target object 101 on the X-Y stage 105. In this manner, the pattern writing apparatus 110 is controlled by a plurality of control units and writes a pattern on the target object 101 using the electron beam 200.

Pieces of parameter information for the plurality of control units 122, 124, and 126 are transmitted, or "output" from external PCs 502 and 504 according to a communication standard "a" regardless of time. The pieces of parameter information are changed, or "converted" by the I/F circuit 142 into pieces of information of the standard of the control calculation unit 130. The resultant pieces of information are stored in the database 140 (storage unit). Furthermore, pieces of file information used in pattern writing in the pattern writing apparatus 110 are transmitted from the external PCs 502 and 504 and stored in the magnetic disk device 146. An apparatus owner can read the stored information from the database 140 or the magnetic disk device 146 by using the communication standard "a" from the main computer 160. In this manner, the parameters transmitted from the external PCs 502 and 504 can be compared to the reference. The parameter information stored in the database 140 is read by the control computer 132, are matched in communication standard by the group (first I/F circuit group) of I/F circuits 134, 136, and 138, and set to at least one of the plurality of the control units 122, 124, and 126. For example, when the parameters are for control unit 122, the standard of the parameter information is changed from the standard in the control calculation unit 130 into a communication standard "b" by the I/F circuit 134, transmitted (output) to the control unit 122, and set thereto. Similarly, for example, when the parameters are for the control unit 124, the standard of the parameter information is changed from that of the control calculation unit 130 into a communication standard "c" by the I/F circuit 136, transmitted (output) to the control unit 124, and set thereto. Similarly, for example, when the parameters are for the control unit 126, the standard of the parameter information is changed from the standard in the control calculation unit 130 into a communication standard "d" by the I/F circuit 138, transmitted (output) to the control unit 126, and set thereto.

In this case, time lag occurs until the parameter information is stored in the database 140 and set in the control units 122, 124, and 126. Meanwhile, the parameters set in the control units 122, 124, and 126 are not matched with the parameters stored in the database 140. For this reason, as described above, when the apparatus owner uses the main computer 160 to read the stored information from the database 140 or the magnetic disk device 146 to compare the information with the reference, the information may differ from the contents of the actual device. In other words, the parameters may change depending on the timing of confirmation.

In Embodiment 1, the parameters set in the control units 122, 124, and 126 are read without passing through the database 140 and the magnetic disk device 146. Since the communication standards of the control units 122, 124, and 126 differ, the main computer 160 cannot easily communicate with the control units 122, 124, and 126 without any change. Therefore, in Embodiment 1, the communication standard "a" used by the main computer 160 and the communication standards "b", "c", and "d" used by the control units 122, 124, and 126 are converted by the I/F circuit group 170 (second I/F circuit group). For example, an I/F circuit 172 matches the communication standard "a" and the communication standard "b" used by the control unit 122 with each other. An I/F circuit 174 matches the communication standard "a" and the communication standard "c" used by the control unit 124 with each other. An I/F circuit 176 matches the communication standard "a" and the communication standard "d" used by the control unit 126 with each other. In this manner, the main computer 160 can communicate with the control units 122, 124, and 126 without passing through the database 140 and the magnetic disk device 146. The I/F circuit group 170 is arranged independently of the control calculation unit 130 so that the main computer 160 can communicate with the control units 122, 124, and 126 without hindering operations performed by the control calculation unit 130. This configuration is not necessarily used. If the I/F circuits 134, 136, and 138 in the control calculation unit 130 have idle ports, the main computer 160 may communicate with the control units 122, 124, and 126 by using the idle ports.

Figure 3:
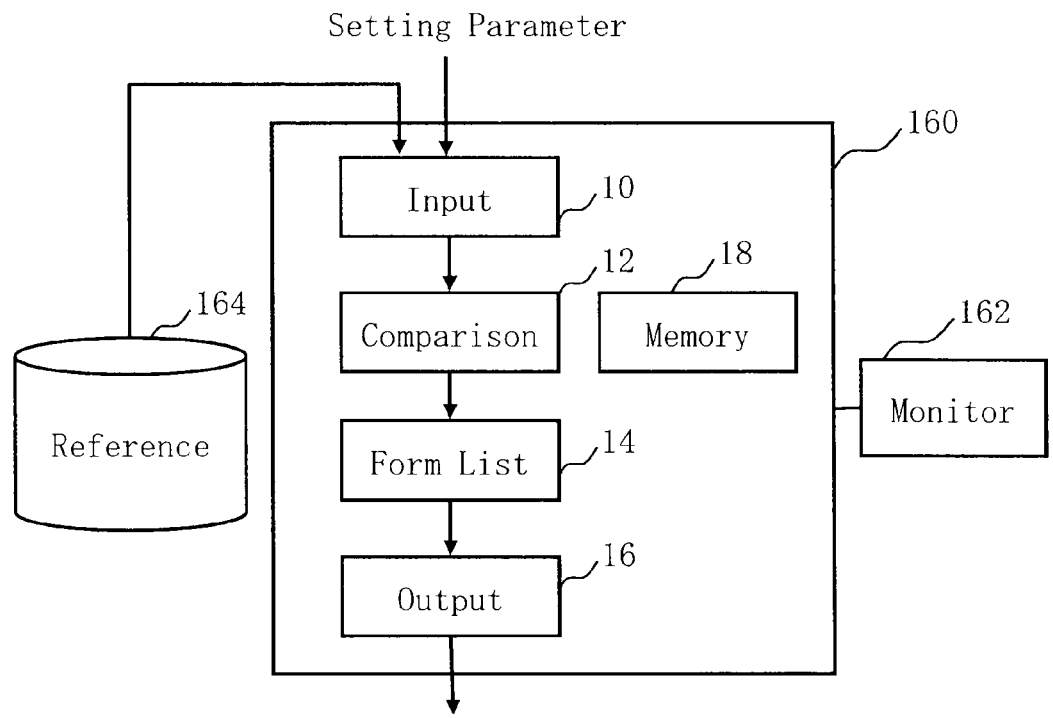
FIG. 3 is a block diagram showing an internal configuration of a main computer in conformity with the main step flow in a parameter monitoring method for the pattern writing apparatus according to Embodiment 1.

FIG. 3 is a block diagram showing an internal configuration of a main computer inconformity with main steps flows in a parameter monitoring method for the pattern writing apparatus according to Embodiment 1. In FIG. 3, in the main computer 160, an input unit 10, a comparison unit 12, a list forming unit 14, an output unit 16, and memory 18 are arranged. Processes of the functions such as the input unit 10, the comparison unit 12, the list forming unit 14, and the output unit 16 are executed by software programs. Alternatively, the functions may be configured by hardware such as an electric circuit, or may be executed by a combination of hardware and software. The functions may be executed by a combination of hardware and firmware. When the functions are configured by programs, said programs are recorded on a recording medium such as the storage device 164 or memory 18.

In one input step, the input unit 10 receives pieces of setting parameter information set in the plurality of control units 122, 124, and 126 set by the external PCs 502 and 504 through the database 140 which can be accessed from external PCs 502 and 504 without passing through the database 140. The main computer 160 transmits information that requests the pieces of setting parameter information been setting in the plurality of control units 122, 124, and 126 to the control units 122, 124, and 126 through the I/F circuit group 170. The control units 122, 124, and 126 output the pieces of setting parameter information set in the communication standards to the I/F circuit group 170. The I/F circuit group 170 receives a request from the main computer 160, reads, or "input" the pieces of parameter information been setting in the plurality of control units 122, 124, and 126 and changes, or "converts" the communication standards of the pieces of parameter information input, into the communication standard "a" used by the main computer 160 without passing through the database 140. The pieces of parameter information set in the plurality of control units 122, 124, and 126 are transmitted, or "output" to the main computer 160 after the converting. With this configuration, the main computer 160 can obtain the pieces of parameter information (setting parameters) been setting in the plurality of actual control units 122, 124, and 126 (plurality of devices) without obtaining the parameter information stored in the database 140. That is, the plurality of real-time parameter information been setting in the plurality of devices through the I/F circuit group 170.

In another input step, the input unit 10 receives pieces of reference (reference parameter) information to be set in the plurality of control units 122, 124, and 126 which control the pattern writing apparatus 110 from the storage device 164 and use different communication standards.

In the comparison step, the comparison unit 12 compares each of the received reference information with corresponding setting parameter information of the received pieces of setting parameter information.

In the list forming step, when the pieces of reference information and the compared pieces of setting parameter information received from the I/F circuit group 170 include at least one set of different pieces of parameter information as a result of comparison, the list forming unit 14 forms a parameter information list with respect to the different pieces of parameter information. In other word, the list forming unit 14 forms the list of at least one set of different parameter information between the each of reference parameter information and the corresponding parameter information compared each other.

Figure 4:
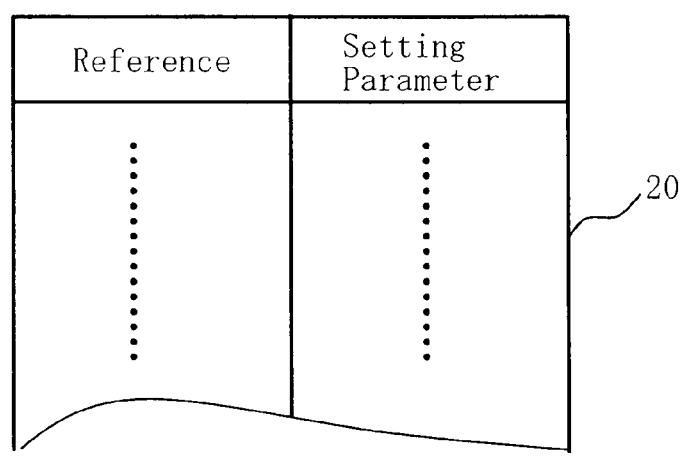
FIG. 4 is a diagram showing an example of a parameter information list in Embodiment 1.
Figure 5:
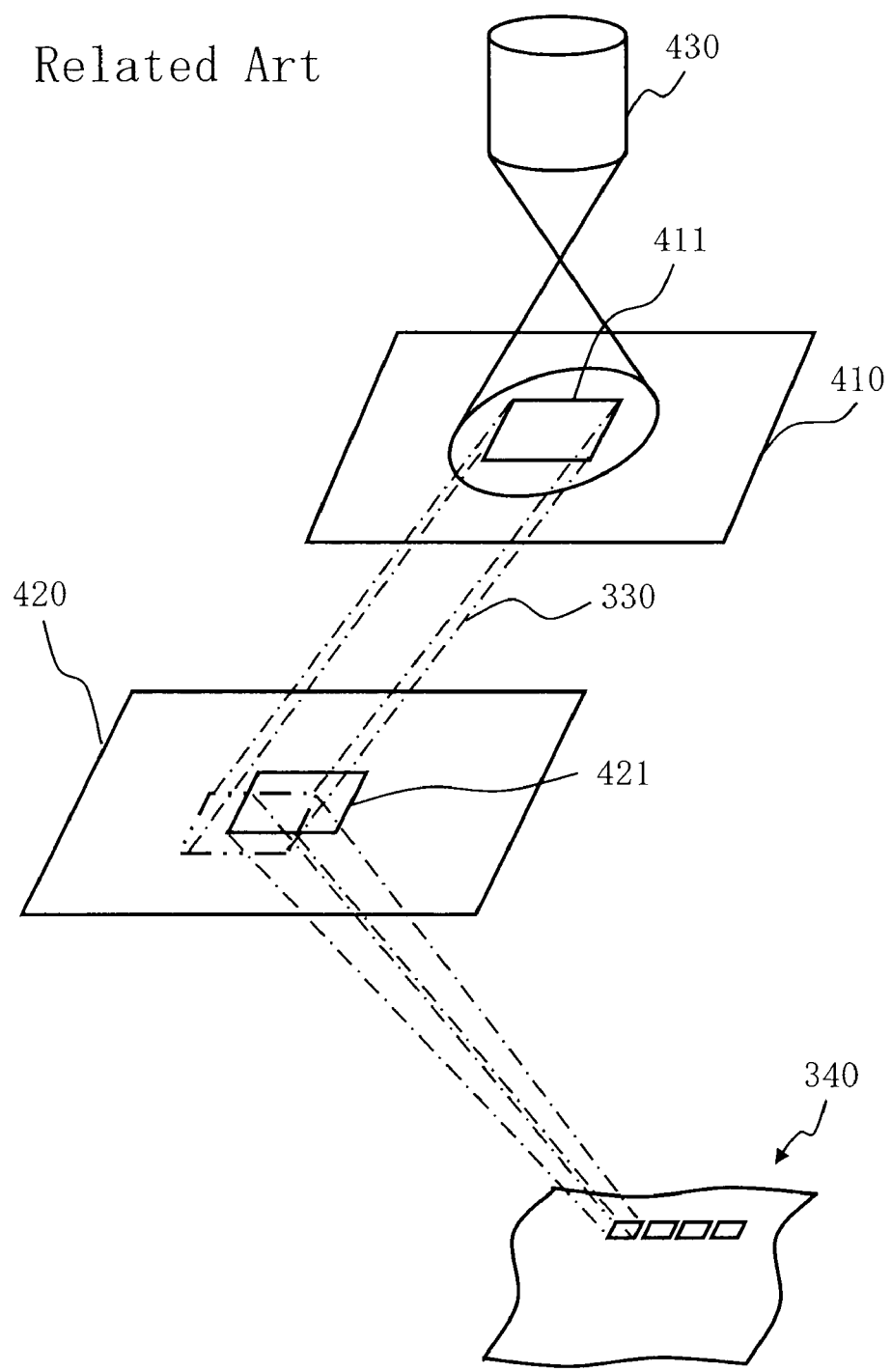
FIG. 5 is a conceptual diagram for explaining operation of a conventional variable-shaped electron beam photolithography apparatus.
Figure 6:
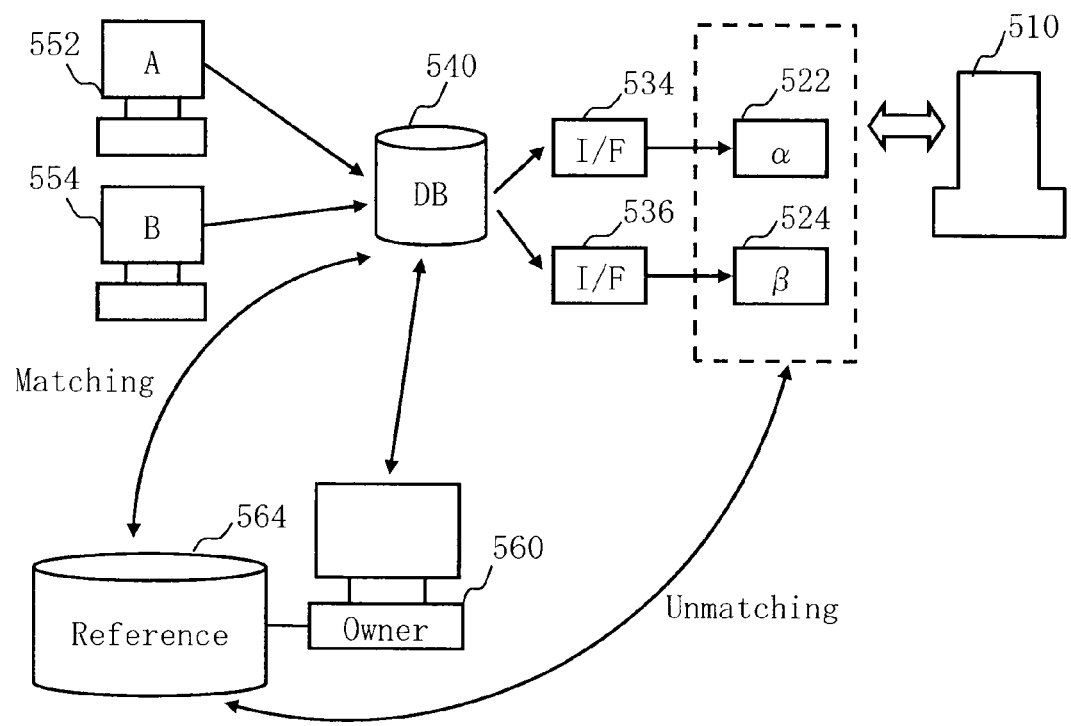
FIG. 6 is a conceptual diagram showing an example of a configuration of a pattern writing system.

FIG. 4 is a diagram showing an example of a parameter information list in Embodiment 1. In FIG. 4, in a parameter information list 20 is defined such that the contents of a reference correspond to the contents of actually set parameters. In this case, all parameters are not listed, only unmatched parameters are preferably extracted and defined. Even though enormous numbers of parameters are sequentially listed, an effort is required to detect an unmatched portion. Only an unmatched parameter is extracted and defined to make it possible to cause the apparatus owner to quickly visually check the contents of the parameter. However, the present invention is not limited to the case in which only the unmatched parameter is defined. All the parameters may be listed.

In the output step, the output unit 16 outputs a comparison result. In this case, the output unit 16 outputs a parameter information list 20. Other information may be output together with the parameter information list 20, such as the information displayed on the monitor 162.

As described above, the main computer 160 inputs reference parameter information that serves as a reference, compares the reference parameter information with the parameter information received from the I/F circuit group 170, and outputs a result. Furthermore, the main computer 160 forms a list of different pieces of parameter information between the reference parameter information and the parameter information received from the I/F circuit group 170 as a comparison result.

The parameters actually set in the control units 122, 124, and 126 can be monitored with the above configuration. As a result, when an incorrect parameter is set, the pattern writing operation can be interrupted or stopped. Alternatively, the pattern writing operation may be continuously performed to make it possible to stop the next pattern writing operation. As a result, the performance of an unexpected pattern writing operation can be avoided, enabling manufacturing of a high-precision mask.

The embodiment is described with reference to the concrete examples. However, the present invention is not limited thereto.

Parts of the apparatus configuration, the control method, and the like which are not directly required for the explanation of the present invention are not described. However, the necessary apparatus configuration and control method are appropriately selected and used. For example, the concrete control unit configuration that controls the pattern writing apparatus 110 is not described. However, the necessary control unit configuration is appropriately selected and used as a matter of course.

In addition, all pattern writing systems and all parameter monitoring methods for pattern writing apparatuses that include the elements of the present invention and can be appropriately changed in design by a person skilled in the art are included in the spirit and scope of the invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern writing system comprising:
   a plurality of control units configured to use different communication standards;
   a pattern writing unit configured to be controlled by the plurality of control units and write a pattern on a target object by using a charged particle beam;
   a storage unit configured to receive parameter information from an external slave computer and store the parameter information;
   a first interface information circuit group configured to output received parameter information to at least one of the plurality of control units in conformity with a communication standard on the at least one of plurality of control units;
   a main computer; and
   a second interface circuit group configured to receive a request from the main computer, input parameter information that has been set in the plurality of control units without passing through the storage unit, convert communication standards of the input parameter information into a communication standard used by the main computer, and output the parameter information whose each communication standard is converted to the main computer, wherein the second interface circuit group is different from the first interface information circuit group.

2. The system according to claim 1, wherein the main computer inputs each of reference parameter information serving as a standard for the plurality of control units, compares the each of reference parameter information with corresponding parameter information of the parameter information received from the second interface circuit group, and outputs the result.

3. The system according to claim 2, wherein the main computer forms a list of at least one set of different parameter information between the each of reference parameter information and the corresponding parameter information compared with each other.

4. The system according to claim 1, wherein the main computer receives each of real-time parameter information that has been set in the plurality of control units through the second interface circuit group.

5. The system according to claim 1, wherein the main computer receives each of the parameter information that has been set in the plurality of control units from the second interface circuit group without passing through the storage unit.

6. A parameter monitoring method for a pattern writing apparatus, comprising:
   receiving each of reference parameter information for setting in a plurality of control units which control the pattern writing apparatus and use different communication standards;
   receiving each of setting parameter information that has been set in the plurality of control units by an external computer through a storage device that can be accessed by said external computer, without passing through the storage device, wherein communication standards of the setting parameter information are converted by a first interface information circuit group before the setting parameter information is set in the plurality of control units passing through the storage device, and each of the setting parameter information that has been set in the plurality of control units is received after communication standards of the setting parameter information that has been set in the plurality of control units are converted by a second interface information circuit group which is different from the first interface information circuit group; and
   comparing, via a processor, a received each of reference parameter information with corresponding setting parameter information of a received each of setting parameter information to output a result.

7. The method according to claim 6, further comprising:
   forming a list of at least one set of different parameter information between the each of reference parameter information and the corresponding setting parameter information compared with each other.

8. The method according to claim 6, wherein the each of setting parameter information received is real-time setting parameter information that has been set in the plurality of control units.

9. The method according to claim 6, wherein before receiving the each of setting parameter information, a communication standard of the each of setting parameter information is converted in conformity with a computer to receive the each of setting parameter information.

* * * * *